United States Patent
Novellini et al.

(10) Patent No.: US 9,378,174 B2
(45) Date of Patent: Jun. 28, 2016

(54) SERDES RECEIVER OVERSAMPLING RATE

(71) Applicant: Xilinx, Inc., San Jose, CA (US)

(72) Inventors: Paolo Novellini, Gorgonzola (IT); Anthony Torza, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 436 days.

(21) Appl. No.: 14/070,851

(22) Filed: Nov. 4, 2013

(65) Prior Publication Data
US 2015/0127877 A1 May 7, 2015

(51) Int. Cl.
*G06F 13/42* (2006.01)
*H03M 9/00* (2006.01)
*H04J 3/06* (2006.01)
*H04L 25/14* (2006.01)

(52) U.S. Cl.
CPC ............. *G06F 13/4282* (2013.01); *H03M 9/00* (2013.01); *H04J 3/0685* (2013.01); *H04L 25/14* (2013.01)

(58) Field of Classification Search
CPC ..... G06F 13/4282; H03M 9/00; H04J 3/0685; H04L 25/14
See application file for complete search history.

(56) References Cited

U.S. PATENT DOCUMENTS

| | | | | |
|---|---|---|---|---|
| 7,161,964 B2* | 1/2007 | Lentine | ...................... | H04J 3/04 370/535 |
| 7,295,604 B2* | 11/2007 | Cranford, Jr. | .......... | H04B 3/462 375/226 |
| 7,890,680 B2* | 2/2011 | Huff | ........................ | H04L 12/26 710/66 |
| 8,249,199 B2* | 8/2012 | Doblar | .................. | H04L 7/0062 375/340 |
| 8,275,025 B2* | 9/2012 | Abel | ........................ | H03L 7/087 327/141 |
| 8,467,436 B1* | 6/2013 | Warner | ................... | H04L 1/205 375/219 |
| 8,571,059 B1* | 10/2013 | Zaliznyak | ............. | G06F 13/385 370/464 |
| 8,576,865 B1* | 11/2013 | Lo | ......................... | H04L 49/557 370/419 |
| 8,718,079 B1* | 5/2014 | Lo | ......................... | H04L 49/557 370/419 |
| 9,100,167 B2* | 8/2015 | Garg | ..................... | H04L 7/0025 |
| 2008/0080600 A1 | 4/2008 | Dai et al. | | |

OTHER PUBLICATIONS

U, Seng-Pan et al., "Design and Analysis of Low Timing-Skew Clock Generation for Time-Interleaved Sampled-Data Systems," *Proc. of the 2002 IEEE International Symposium on Circuits and Systems*, May 26, 2002, pp. IV-441 to IV-444, vol. 4, IEEE, Piscataway, New Jersey, USA.
Specification and drawings for U.S. Appl. No. 13/625,100, filed Sep. 24, 2012, Novellini.
Specification and drawings for U.S. Appl. No. 14/064,539, filed Oct. 28, 2013, Novellini.
Athavale, Abhijit et al., High-Speed Serial I/O Made Simple, *Connectivity Solutions*, Edition 1.0, PN0402399, Apr. 2005, pp. 1-210, Xilinx, Inc., San Jose, California, USA.

(Continued)

*Primary Examiner* — M Elamin
(74) *Attorney, Agent, or Firm* — W. Eric Webstad

(57) ABSTRACT

An apparatus relates generally to serializer-deserializers. In such an apparatus, a first serializer-deserializer has a first data path and a data eye path. The first data path is coupled to a first data out interface of the first serializer-deserializer. A second serializer-deserializer has a second data path. The second data path is coupled to a second data out interface of the second serializer-deserializer. The data eye path of the first serializer-deserializer is coupled to the second data path of the second serializer-deserializer.

20 Claims, 5 Drawing Sheets

(56) References Cited

OTHER PUBLICATIONS

Fu, Harry et al. *Serial Link Signal Integrity Analysis with IBIS-AMI Simulation and On-Chip Eye Scan for Low-Cost, High-Volume FPGA Transceivers*, WP428 (v1.0), Nov. 30, 2012, pp. 1-11, Xilinx, Inc., San Jose, California, USA.

Jenkins, Mike et al., *Eye Scan with MicroBlaze Processor MCS*, XAPP743 (v1.0), Oct. 18, 2002, Xilinx, Inc., San Jose, California, USA.

Novellini, Paolo et al., *Dynamically Programmable DRU for High-Speed Serial I/O*, XAPP875 (v1.1), Jan. 13, 2010, Xilinx, Inc., San Jose, California, USA.

U, Seng-Pan et al., "Design and Analysis of Low Timing-Skew Clock Generation for Time-Interleaved Sampled-Data Systems," *Proc. of the 2002 IEEE International Symposium on Circuits and Systems*, May 26, pp. IV-441 to IV-444, vol. 4, IEEE, Piscataway, New Jersey, USA.

\* cited by examiner

SERDES RECEIVER OVERSAMPLING RATE

TECHNICAL FIELD

The following description relates to integrated circuit devices ("ICs"). More particularly, the following description relates to a serializer-deserializer ("SERDES") oversampling rate for an IC.

BACKGROUND

There are applications where a receiver serializer-deserializer is locked to a reference mode to process oversampled data. However, as demand for higher line and oversampling rates increase, cost and complexity of oversampling data at such higher rates likewise increases. This has meant adding substantial cost in terms of circuit resources and/or complexity for increasing oversampling line rate. Hence, it is desirable and useful to increase oversampling line rate without significantly adding additional resources and/or without complex circuitry.

SUMMARY

An apparatus relates generally to serializer-deserializers. In such an apparatus, a first serializer-deserializer has a first data path and a data eye path. The first data path is coupled to a first data out interface of the first serializer-deserializer. A second serializer-deserializer has a second data path. The second data path is coupled to a second data out interface of the second serializer-deserializer. The data eye path of the first serializer-deserializer is coupled to the second data path of the second serializer-deserializer.

A method relates generally to serializer-deserializers. First serial information is received by a first serializer-deserializer at a line rate. The first serial information is oversampled on each of a first data path and a data eye path of the first serializer-deserializer to respectively provide first parallel information and second parallel information. The first data path is coupled to a first data out interface of the first serializer-deserializer. The first parallel information is output via the first data out interface. The second parallel information is provided from the data eye path of the first serializer-deserializer to a second data path of a second serializer-deserializer. The second data path is coupled to a second data out interface of the second serializer-deserializer. The second parallel information is output via the second data out interface.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
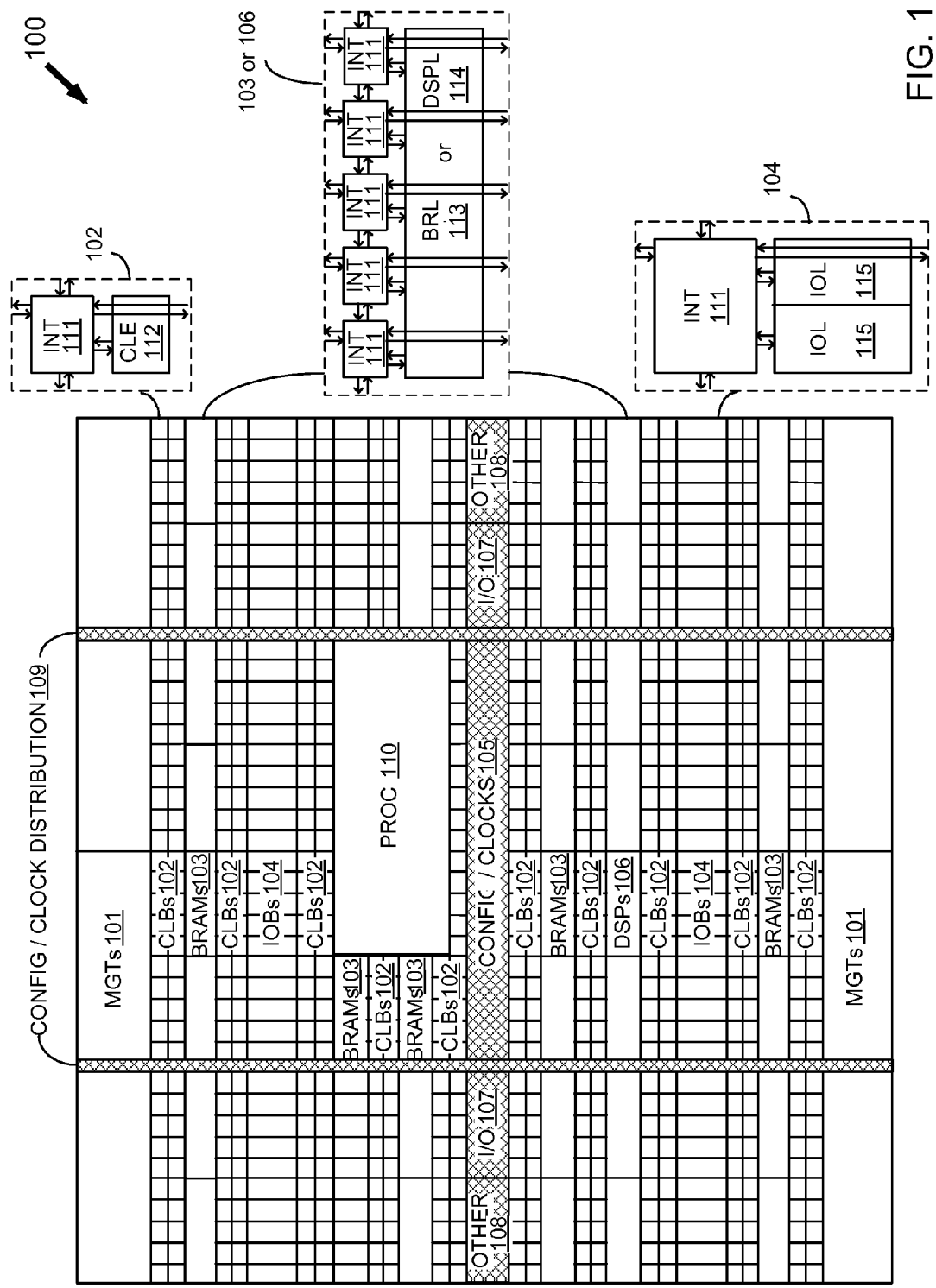
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

A serializer-deserializer ("SERDES") is used in communication, such as for high-speed serial links. A transceiver used to provide a SERDES may have a data eye path. Description of such a data eye path may be found in more detail in "Serial Link Signal Integrity Analysis with IBIS-AMI Simulation and On-Chip Eye Scan for Low-Cost, High-Volume FPGA Transceivers" by Harry Fu and Romi Mayder in a white paper (WP428 version 1.0) dated Nov. 30, 2012 published by Xilinx, Inc. of San Jose, Calif. ("Xilinx"). Furthermore, an eye scan using a microprocessor formed of programmable resources of an FPGA may be used, such as described in "Eye Scan with MicroBlaze Processor MCS" by Mike Jenkins and David Hahashin in a Xilinx Application Note ("XAPP743 version 1.0) dated Oct. 18, 2012 published by Xilinx. Such a data eye or eye scan path of a SERDES formed with such a transceiver did not extend to FPGA programmable fabric, sometimes referred to as FPGA programmable resource or FPGA logic.

However, as described below in additional detail, by coupling a data eye path of one transceiver, or a receiver portion thereof to be more particular, to an output path of another receiver portion of another transceiver, effectively such data eye path of one SERDES may be used to couple to such FPGA fabric through an interface of another SERDES. This may be used to increase an effective oversampling rate with an actual clock frequency used to perform such oversampling being a fraction of such effective oversampling rate.

With the above general understanding borne in mind, various configurations for SERDES systems are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
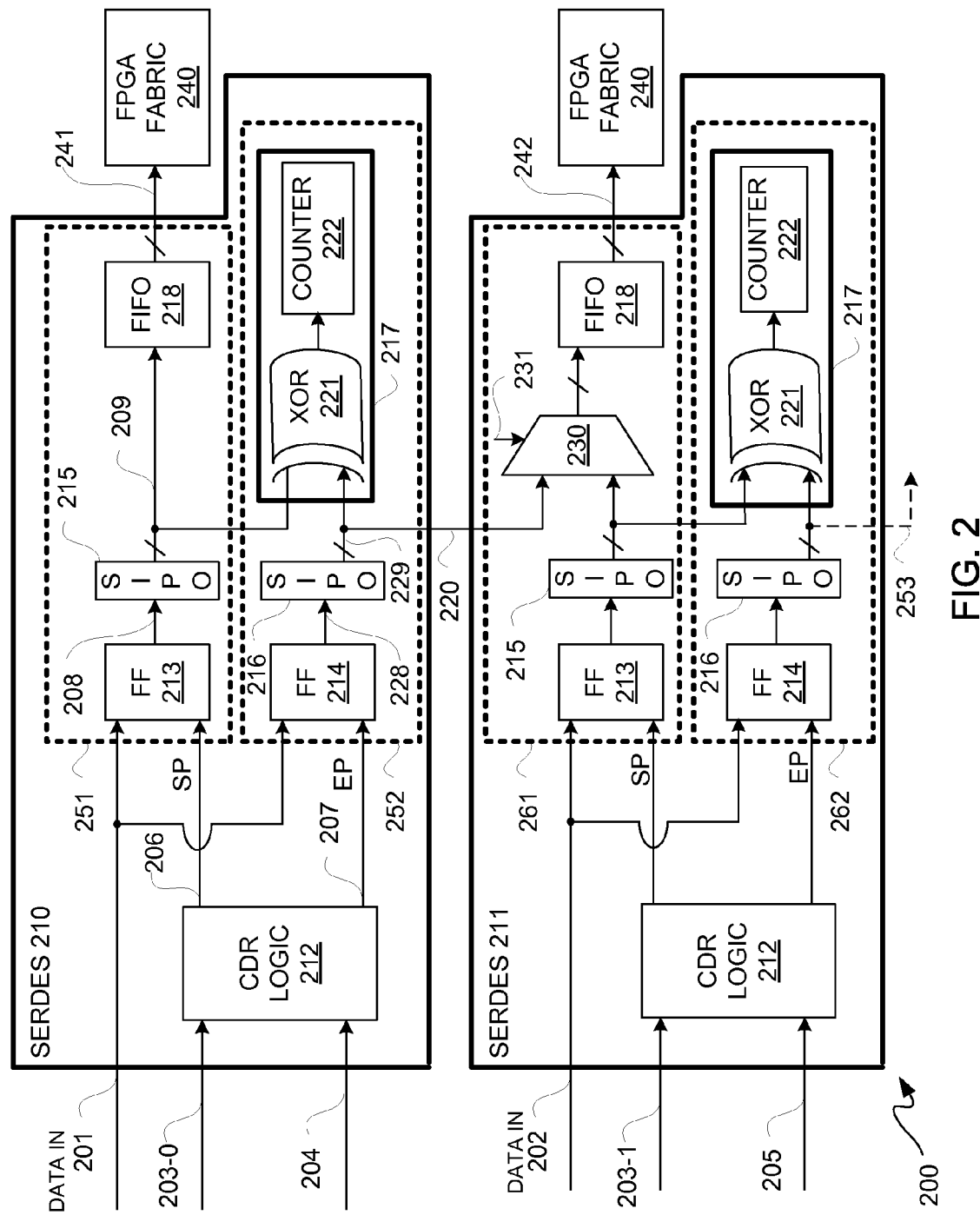
FIG. 2 is a block diagram depicting an exemplary serializer-deserializer ("SERDES") system.

FIG. 2 is a block diagram depicting an exemplary serializer-deserializer ("SERDES") system 200. SERDES system 200 may be implemented in FPGA 100 of FIG. 1 using transceivers thereof. However, SERDES system 200 may more generally be implemented in any IC having two or more SERDES, such as SERDES 210 and SERDES 211. In this example, SERDES 210 and SERDES 211 are receiver SERDES.

Each SERDES 210 and 211 has a data input path for receiving input data signals 201 and 202, respectively. Each SERDES 210 and 211 includes: a clock data recovery ("CDR") logic block 212; a pair of registers, such as generally indicated as flip-flops or FF 213 and FF 214; a pair of serial input-to-parallel output converters ("SIPOs"), such as generally indicated as SIPO 215 and SIPO 216; an eye scan control logic block 217; and a first-in, first-out buffer ("FIFO") 218. In this example, eye scan control logic 217 is illustratively depicted as including an XOR gate 221 and a counter 222; however, this or other circuitry may be used to provide eye scan control logic 217. Additionally, SERDES 210 has a data out interface 241 to FPGA fabric 240, and SERDES 211 has a data out interface 242 to FPGA fabric 240. Even though FPGA fabric 240 is illustratively depicted as two separate blocks, and in some implementations may be parsed, generally FPGA fabric 240 may be considered an array, including multiple arrays, of programmable resources accessible through data out interfaces 241 and 242.

In contrast to SERDES of the past, SERDES 210 and 211 are coupled to one another via the addition of a SERDES-to-SERDES path 220 and a multiplexer 230. In this example, a dedicated multiplexer 230 is added to a data output path of SERDES 211; however in another configuration multiplexer 230 may be provided as glue logic between two SERDES. Moreover, SERDES 210 may optionally be configured with another multiplexer 230 for coupling to another SERDES (not shown) or for forming each SERDES the same.

SERDES 210 and 211 may respectively receive a user lock to reference control signal 203-0 and 203-1, as well as respectively receive a user exploratory phase ("EP") control signal 204 and 205, to their respective CDR logic blocks 212. Each CDR logic block 212 in response to such control signal may provide a sampling phase ("SP") signal, such as SP signal 206, and an exploring phase ("EP") signal, such as EP signal 207.

With reference to SERDES 210, SP signal 206 may be used to clock data from input data signal 201 into FF 213 for sampling at an oversampling frequency. Input data from input data signal 201 may be provided as data input to FF 213. Furthermore, SP signal 206 may be provided as a clock input to FF 213. Thus, data from input data signal 201 may be clocked in and out of FF 213 by SP signal 206 for oversampling. In other words, data from input data signal 201 may be oversampled at a set SP of SP signal 206. Serial data 208 from FF 213 is provided as an input to SIPO 215, and deserialized information ("parallel data") 209 from SIPO 215 is provided as a data input to FIFO 218 and to eye scan logic block 217. A serial input data clock and a slower parallel data output clock (neither of which is illustratively depicted for purposes of clarity) may be used to clock in serial data 208 and to clock out parallel data 209, respectively. FIFO 218 may be clocked (not shown for purposes of clarity) to input and output data from parallel data 209 to provide such data via interface 241 to FPGA fabric 240.

With continuing reference to SERDES 210, EP signal 207 may be used to clock data from input data signal 201 into FF 214 for sampling at an oversampling frequency, namely at the same frequency used for oversampling with FF 213. This frequency may be a fraction of an effective oversampling frequency for reasons as described herein. Input data from input data signal 201 may be provided as data input to FF 214. Furthermore, EP signal 207 may be provided as a clock input to FF 214. Thus, data from input data signal 201 may be clocked in and out of FF 214 by EP signal 207 for oversampling. In other words, data from input data signal 201 may be oversampled at a set EP of EP signal 207. Serial data 228 from FF 214 is provided as an input to SIPO 216, and deserialized information ("parallel data") 229 from SIPO 216 is provided as a data input to multiplexer 230 of SERDES 211 and to eye scan logic block 217 of SERDES 210. A serial input data clock and a slower parallel data output clock (neither of which is illustratively depicted for purposes of clarity) may be used to clock in serial data 228 and to clock out parallel data 229, respectively, and such clocks may be the same as those used for clocking input and output sides of SIPO 215, as previously described.

As described above, SERDES 210 generally has a data path 251 and a data eye path 252. As data eye path 252 effectively is coupled to receive data from parallel data 229 without interfering with providing such data to FPGA fabric 240, data eye path 252 is a non-disruptive or non-destructive eye scan path. Furthermore, but for addition of SERDES-to-SERDES path 220, data eye path 252 is not coupled to FPGA fabric 240. In particular, data eye path 252 is not coupled to data out interface 241 of SERDES 210, where data eye path 252 is part of SERDES 210.

SERDES 211 is similar to SERDES 210, and thus same description therefor is not repeated for purposes of clarity and not limitation. SERDES 211 includes a multiplexer 230 coupled to receive parallel data 229 output from SIPO 216 of SERDES 210, and such parallel data 229 is provided as a data input to multiplexer 230 via SERDES-to-SERDES path 220. Another input to multiplexer 230 is parallel data output from SIPO 215 of SERDES 211; however, for purposes of clarity and not limitation, this input is not used in this implementation. A control select signal 231 is provided to multiplexer 230 to select between inputs thereto. For this implementation, control select signal 231 is set to select parallel data 229 on SERDES-to-SERDES path 220 for output from multiplexer 230. Parallel data 229 output from multiplexer 230 is input to FIFO 218 of SERDES 211. Parallel data 229 output from FIFO 218 of SERDES 211 may be provided to FPGA fabric 240 via data out interface 242. Accordingly, a data path 261 of SERDES 211 may be used in part to effectively couple a part of data eye path 252 to FPGA fabric 240. Optionally, SERDES 211 may have a SERDES-to-SERDES path 253 to couple to another SERDES the same or similar to SERDES 211, so optionally a data eye path 262 may be coupled to a data path of such other SERDES for coupling to another interface to FPGA fabric 240.

Some applications involve at least some oversampling of incoming data; however, an oversampling rate or multiplier may vary from application to application. An example of use of oversampling is a burst CDR for a gigabit-capable passive optical network ("GPON") application; however, there are many applications for oversampling data. For purposes of clarity by way of example and not limitation, it shall be assumed that a five times ("5×") oversampling rate is used. Conventionally, analog data is input to an analog-to-digital converter ("ADC"), such as a one-bit analog-to-digital converter for example, to provide digital data. If an incoming data rate or line rate is 10 gigabits per second ("Gb/s"), then such an ADC conventionally would have to be clocked at a frequency sufficient to provide an oversampling data rate of 50 Gb/s. However, if the same data is provided in multiple streams, then such oversampling rate may be reduced by a factor of the number of streams. This may be used to reduce oversampling clock frequency which may significantly reduce complexity, or even make feasible some oversampling applications not previously feasible with FPGAs. In the above example, an oversampling data rate of 25 Gb/s may be at one phase and another oversampling data rate of 25 Gb/s may be at another phase 180 degrees away, and such oversampled data streams may be combined to provide a single oversampled data stream with an equivalent oversampling data rate of 50 Gb/s.

Addition of a multiplexer and a SERDES and a SERDES-to-SERDES path does not involve a significant amount of additional circuitry, and maintains a one-to-one ratio of output SERDES FIFOs to FPGAs interface on an IC. Furthermore, such change may be implemented entirely within a physical coding sublayer ("PCS") level as dedicated logic, namely a hard macro or hardware, of SERDES 211. No changes to a physical medium attachment ("PMA") portion of a SERDES need be made. No additional SERDES to FPGA fabric interfaces are added, so a one-to-one ratio thereof is maintained. Accordingly, the amount of cost for addition of multiplexer 230 and SERDES and a SERDES-to-SERDES path 220 may be insignificant as compared with the additional benefit of effectively reducing an oversampling clock frequency by half. Furthermore, data on interfaces 241 and 242 is the same data, though phase shifted, as described in additional detail below.

Along the above lines, a data eye path 252 may for example be used to determine an optimum sampling phase for sampling data of input data signal 201. With such an optimum sampling phase set, CDR logic 212 may be used to set an EP 180 degrees out-of-phase from such optimum sampling phase set. In other words, EP is adjustable to be set ½ of a unit interval ("UI") away from such optimum SP, wherever such optimum SP is set. More generally, EP is adjustable and thus may be exactly set to a UI/2, or thereabouts as may slightly vary due to data eye asymmetry, out-of-phase with respect to SP. Accordingly, deserialized data at an SP may be output to FPGA fabric 240 via interface 241 and such same deserialized data though at an EP may be output to FPGA fabric 240, where such EP may be set to be 50% of a UI away compared to such SP. This allows equivalent oversampled data throughput to be double that of a single SERDES without doubling an interface of such single SERDES, or more particularly a receiver ("RX") SERDES. For purposes of clarity and not limitation, parallel data 209 and parallel data 229 are hereinafter referred to as SP parallel data 209 and EP parallel data 229.

Because SP parallel data 209 and EP parallel data 229 pass through different FIFOs 218 for respectively coupling to interfaces 241 and 242 to FPGA fabric 240, such data is no longer aligned at an FPGA fabric level. In other words, when going from a parallel data clock domain on an input clock side of a FIFO 218 of SERDES 210 or 211 clock domain to a parallel data clock domain on an output clock side of such FIFO 218 of an FPGA fabric 240 clock domain, there may be misalignment of such data as between interfaces 241 and 242. For clocking out data from FIFOs 218, a clock signal from FPGA fabric 240 is used in this example. Such clock signal may propagate along a clock tree of such FPGA fabric 240, and so there may be misalignment in phase between data on interfaces 241 and 242 due to slight clock signal propagation delays even though at the same frequency. Along those lines, SERDES 210 and 211 may be configured for independent operation from one another, and thus interfaces 241 and 242 may not be coupled for phase aligned operation. For high frequency applications, even slight misalignment may be significant. This misalignment may further be due to timing differences caused by multiplexer 230, SERDES-to-SERDES path 220, and/or differences between SERDES 210 and 211. However, even though two SERDES may be different from one another, it should be understood that only multiplexer 230, SERDES-to-SERDES path 220, and FIFO 218 of SERDES 211 are set apart from SERDES 210, and thus for a high frequency application where misalignment may be significant, opportunities for such misalignment are substantially reduced as only one CDR logic block 212 of SERDES 210 and only one input data stream input to such SERDES 210 are used.

Figure 3:
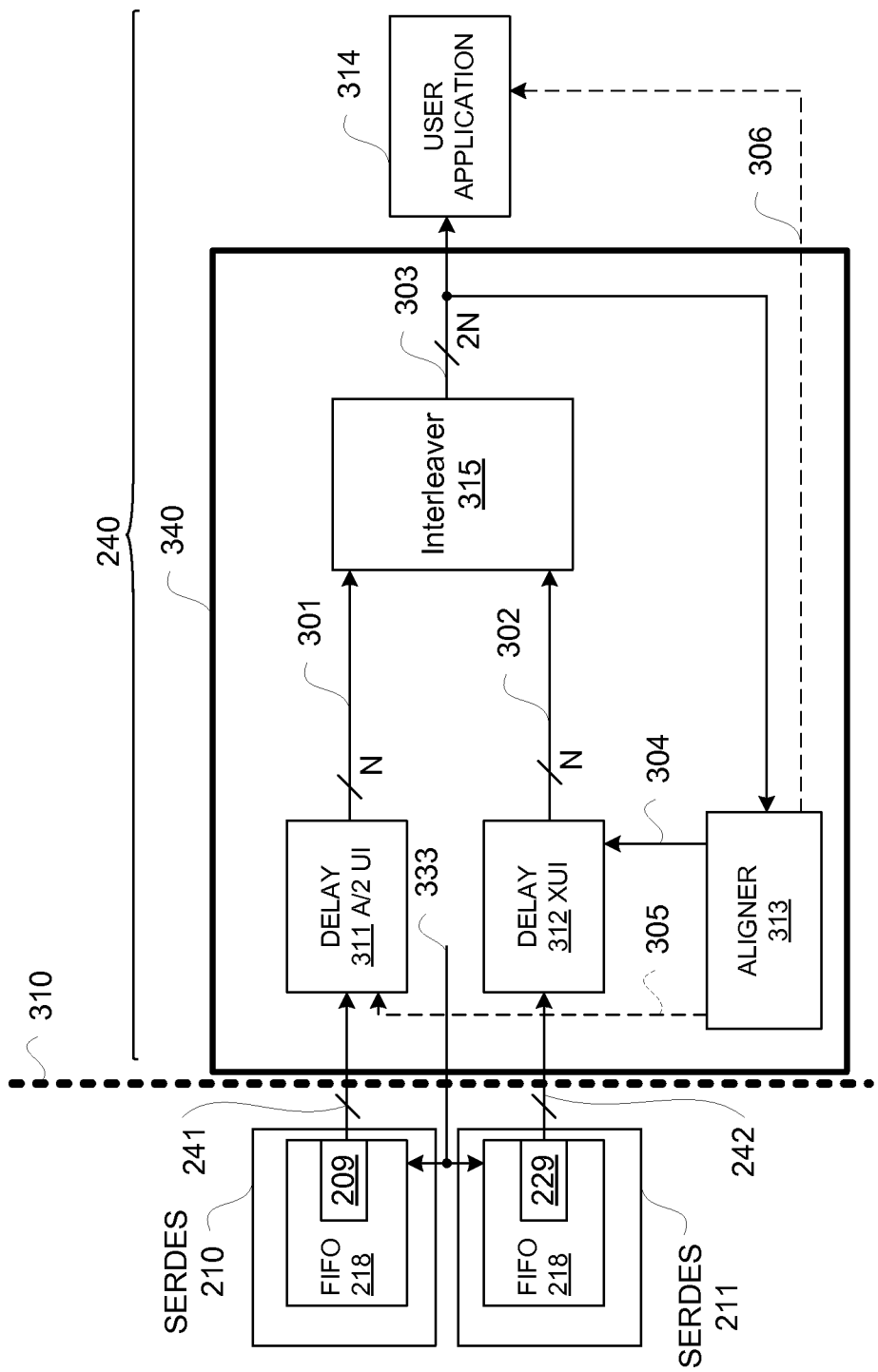
FIG. 3 is a block diagram depicting an exemplary deskewer.

FIG. 3 is a block diagram depicting an exemplary deskewer 340. Deskewer 340 may be instantiated in programmable resources of FPGA fabric 240 on an FPGA fabric side of a SERDES-to-FPGA fabric border 310. Along those lines, deskewer 340 may be coupled between a user application 314, which may be instantiated in whole, or in part, in FPGA fabric 240, and interfaces 241 and 242 respectively of SERDES 210 and 211. Deskewer 340 includes delay 311, delay 312, interleaver 315, and aligner 313, and some or all of each of delay 311, delay 312, interleaver 315, and aligner 313 may be instantiated in programmable resources of FPGA fabric 240.

SP parallel data 209 is provided via data out interface 241 to a fixed digital delay 311 of aligner 240 coupled thereto, and EP parallel data 229 is provided via data out interface 242 to a programmable digital delay 312 of aligner 240 coupled thereto. FIFOs 218 respectively of SERDES 210 and 211 may be clocked on output sides thereof responsive to clock signal 333 provided from FPGA fabric 240 side of SERDES-to-FPGA fabric border 310 to such FIFOs on a SERDES side thereof. More generally, at least one of delays 311 and 312 is adjustable relative to one another for skew adjustment between first information on data out interface 241 and second information on data out interface 242. Thus, for example, both delays could be programmable, where one is set to a fixed value to provide a reference. Thus, for purposes of clarity and not limitation, it is assumed that a fixed delay 311 coupled to SERDES 210 via data out interface 241 is used as a reference.

Fixed digital delay 311 outputs SP data 301, and programmable digital delay 312 outputs EP data 302. SP data 301 and EP data 302 are both bit serial data provided in parallel respectively of parallel data 209 and 229, and thus both streams are 180 degrees, or 0.5 UI, out-of-phase with respect to one another, as previously described. However, FIFOs 218 respectively coupled to data out interfaces 241 and 242 may have a skew with respect to one another which is a fraction of a UI, which fraction of a UI is a value "X".

SP data 301 and EP data 302 respectively from delays 311 and 312 are provided as inputs to interleaver 315 of deskewer 340, and interleaver 315 is configured to interleave information, such as SP data 301 and EP data 302, to provide interleaved information, such as interleaved data 303. For example, for each of SP data 301 and EP data 302 being N-bits wide, bit interleaved data 303 provided as output from interleaver 315 may be 2N bits wide. Such interleaved data 303 may be provided to a user application 314 coupled to interleaver 315, and such interleaved data 303 is provided as an input to aligner 313 of deskewer 340 coupled to interleaver 315.

Aligner 313 optionally may be coupled to a programmable digital delay 311 to provide an adjustment via an optional adjustment signal 305, where both SP and EP data are delay adjusted. Again, however, for purposes of clarity and not limitation, it shall be assumed that delay 311 is a fixed digital delay. Aligner 313 is configured to provide an adjustment increment X via adjustment signal 304 to programmable or adjustable digital delay 312. Adjustment increment X is a skew adjustment between information on data out interface 241 and information on data out interface 242, namely respectively parallel data 209 and parallel data 229. If both delays 311 and 312 are adjustable responsive to respective adjustment signals 305 and 304 for skew adjustment for data in interfaces 241 and 242, then such skew adjustment may be in only one direction between information on data out interface 241 and information on data out interface 242.

At an FPGA fabric level, skew of two oversampled data streams 180 degrees out-of-phase with respect to one another is X.5 UI, where X may be an unknown integer number of tics representing a fraction of a UI. Again, 0.5 UI portion of such relationship may be guaranteed by setting EP data 229 relative to SP data 209, as previously described. Accordingly, X may be searched for in a limited range, from −A to +A, where delay A is effectively a maximum possible skew as defined by structure of a FIFO 218. Along those lines, a fixed delay of delay 311 may be A/2 of a UI, or a A/2 times a UI. At startup, in presence of data, all possible values for X may be scanned by aligner 313 using interleaved data 303. Any wrong configuration of such data may show up in the presence of at least one "101" or "010" in such interleaved oversampled data. Hence, aligner 313 may select a value for X such that interleaved oversampled data does not have an incorrect pattern appear. Once aligner 313 has adjusted delay of delay 312 such that a problem pattern does not appear, then at this point in time, a lock signal 306 may optionally be asserted by aligner 313 and provided to user application 314, such lock signal 306 may be used to indicate that oversampled interleaved data 303 provided to user application 314 is valid.

During runtime, the presence of invalid patterns "101" and "010" may be continually searched for in interleaved oversampled data 303 by aligner 313. As neither of such patterns appears until alignment has been lost, a correct alignment may be provided at each startup and may be checked so that such correct alignment is maintained over time during operation.

Figure 4:
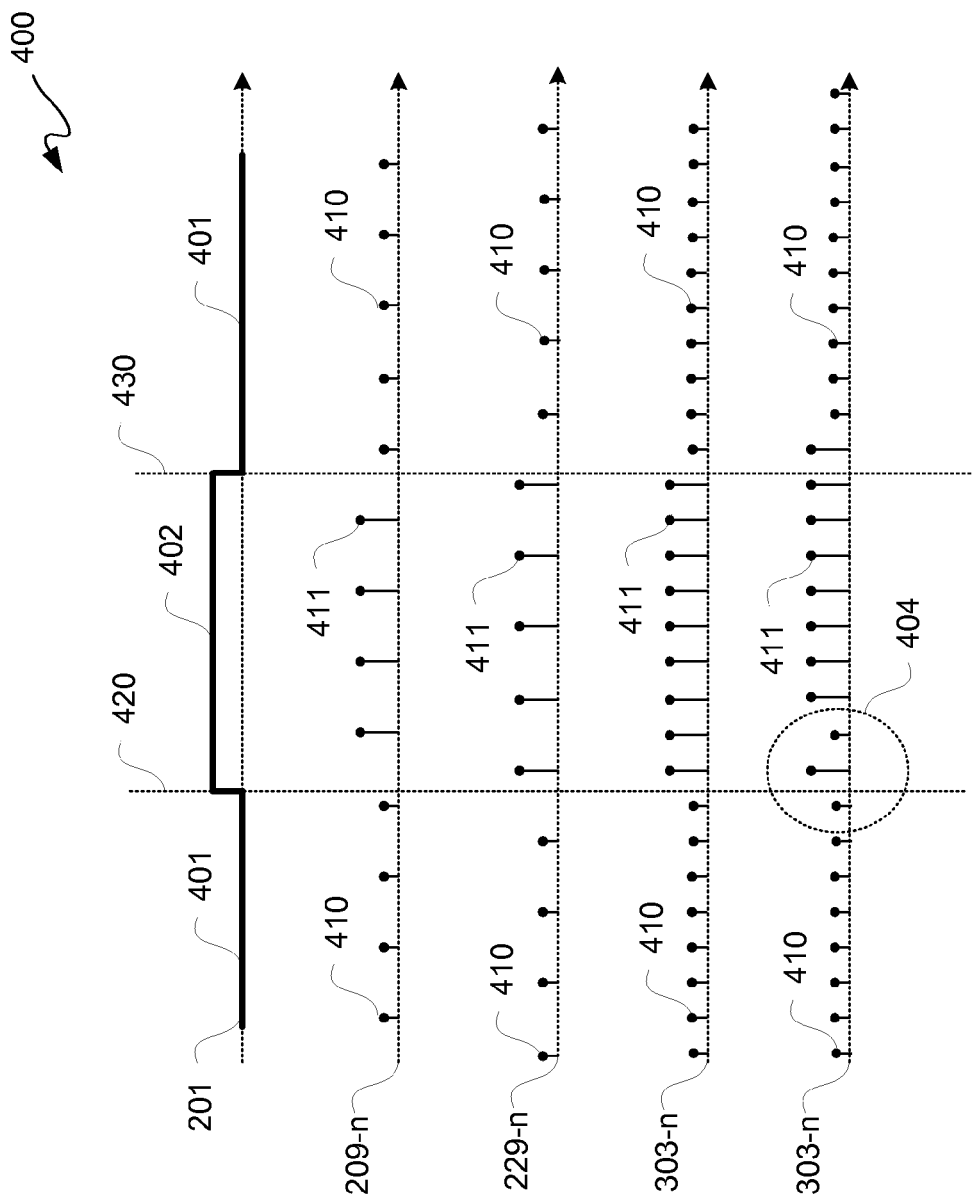
FIG. 4 is a signal diagram depicting exemplary signals.

For purposes of clarity by way of example and not limitation, FIG. 4 is a signal diagram depicting exemplary signals 400. Signals 400 are further described with simultaneous reference to FIGS. 2 through 4.

Incoming data of input data signal 201 is sampled by a first and a second oversampler, such as for example respective one-bit ADCs which are generally indicated as FF 213 and FF 214. Output from such oversamplers may respectively be thought of as serial data 208 and serial data 228. In this example, input data signal 201 is at a logic low level 401 until time 420, and between time 420 and a later time 430, input data signal 201 is at a logic high level 402. Lastly, input data signal 201 in this example is at a logic low level 401 after time 430. For each logic low level 401 sample taken by such FF 213 and FF 214 before time 420, a logic 0 bit 410 is sampled, and for each logic high level 402 sample taken by such FF 213 and FF 214 after time 420 but before time 430, a logic 1 bit 411 is sampled. Lastly, for each logic low level 401 sample taken by such FF 213 and FF 214 after time 430, a logic 0 bit 410 is sampled.

Recall, such data is oversampled, and thus multiple sampled bits represent a single data bit. Any two n-th position bits of parallel data 209 and 229 may be compared against one another, namely SP parallel data 209-n and EP parallel data 229-n. If such nth bit positions of SP parallel data 209-n and EP parallel data 229-n are not skewed, or at least not significantly skewed, with respect to one another, then interleaved data 303 at such n-th bit position has no "101" or "010" bit pattern, such as the upper example of oversampled interleaved data 303-n which has no "101" or "010" bit pattern. If, however, a digital delay is inserted between such n-th bit positions for oversampled data due to FIFOs, then such oversampled interleaved data 303-n has at least a "101" or "010" bit pattern. In the lower example of oversampled interleaved data 303-n, a "010" bit pattern 404 of such oversampled interleaved data 303-n indicates that output of FIFO 218 of SERDES 210 is delayed, or more generally askew, with respect to output of FIFO 218 of SERDES 211 at such n-th bit position. Of course, other examples of such incorrect patterns indicating a skew, which may occur at either or both of transition times 420 or 430, are possible. If for purposes of clarity by way of example and not limitation, maximum skew A is maximum of one-tenth of a UI which may be represented by 6 tics or increments of a programmable delay, then aligner 313 may be configured to adjust delay via adjustment signal 304 for each of such 6 increments in a positive delay direction and each of such 6 increments in a negative delay direction to select a delay where no "101" pattern and no "010" pattern appears in any n-th bit lane of oversampled interleaved data 303.

Even though only one EP was described for a scan eye, in other configurations more than one sampling phase may be available for a scan eye. In such configurations, such plural scan eye sampling phases may respectively be provided to other SERDES for using their data out interfaces to further reduce rate at which data is oversampled, and such oversampled data paths may be combined to provide oversampled data with an effective sampling rate multiple higher than an actual sampling rate. Heretofore, for a SERDES receiver, the maximum oversampling data rate equaled the maximum data rate. However, as described herein, the maximum oversampling data rate of a SERDES receiver is a multiple of scan eye sampling phases of the maximum data rate of such SERDES receiver.

Figure 5:
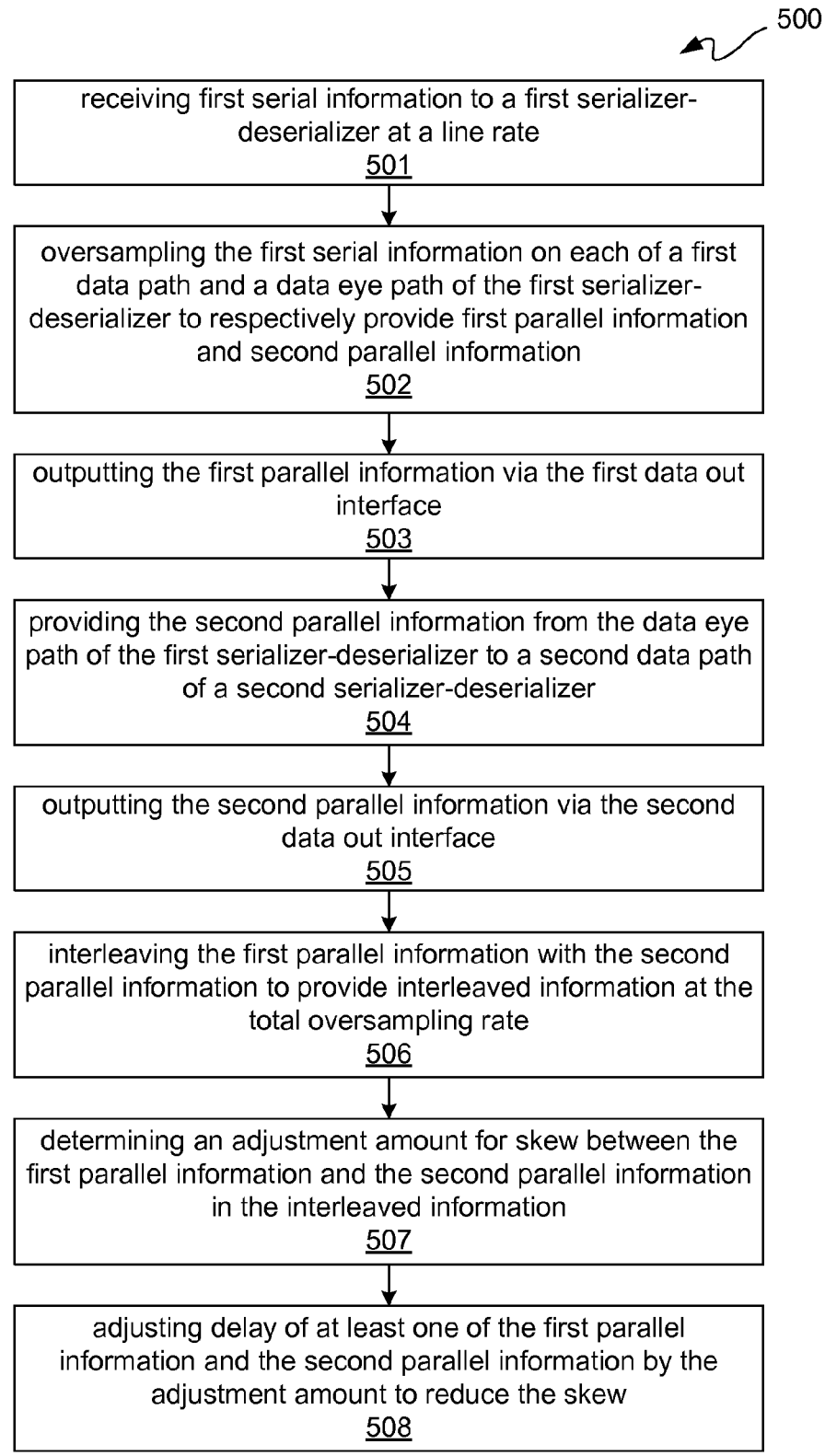
FIG. 5 is a flow diagram depicting an exemplary oversampling process.

FIG. 5 is a flow diagram depicting an exemplary oversampling process 500. Oversampling process 500 is further described with simultaneous reference to FIGS. 2, 3, and 5.

At 501, first serial information may be received by a first serializer-deserializer at a line rate, such as input data signal 201 received by SERDES 210 for example. At 502, such first serial information may be oversampled on each of a first data path and a data eye path of such first serializer-deserializer to respectively provide first parallel information and second parallel information. This oversampling may be performed by FF 213 and 214 with deserialization by SIPOs 215 and 216 respectively on paths 251 and 252 to provide SP parallel data 209 and EP parallel data 229. Each of such first parallel information and such second parallel information may be oversampled at one-half of an effective oversampling rate. Again, such data path 251 is coupled to a data out interface 241 of SERDES 210.

At 503, such first parallel information provided at 502 may be output via such first data out interface, such as interface 241 for example. At 504, such second parallel information provided at 502 may be output from such data eye path of such first serializer-deserializer to a second data path of another serializer-deserializer, such as data eye path 252 of SERDES 210 to data path 261 of SERDES 211. Again, such data path 261 is coupled to a data out interface 242 of SERDES 242.

At 505, such second parallel information provided at 504 may be output via such second data out interface, such as data out interface 242 for example. At 506, such first parallel information may be interleaved with such second parallel information to provide interleaved information at such effective oversampling rate. At 507, an adjustment amount may be determined to adjust for skew between such first parallel information provided at 502 and such second parallel information provided at 504 in such interleaved information provided at 506. At 508, delay of at least one of such first parallel information and such second parallel information may be adjusted by such adjustment amount determined at 507 to reduce such skew.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
a first serializer-deserializer;
wherein the first serializer-deserializer has a first data path and a data eye path;
wherein the first data path is coupled to a first data out interface of the first serializer-deserializer;
a second serializer-deserializer;
wherein the second serializer-deserializer has a second data path;
wherein the second data path is coupled to a second data out interface of the second serializer-deserializer; and
wherein the data eye path of the first serializer-deserializer is coupled to the second data path of the second serializer-deserializer.

2. The apparatus according to claim 1, wherein:
the data eye path is a first data eye path; and
the second serializer-deserializer has a second data eye path.

3. The apparatus according to claim 1, further comprising:
a first delay coupled to the first data out interface;
a second delay coupled to the second data out interface; and
wherein at least one of the first delay and the second delay is adjustable relative to one another for skew adjustment between first information on the first data out interface and second information on the second data out interface.

4. The apparatus according to claim 3, further comprising:
an interleaver coupled to the first delay and the second delay to interleave the first information and the second information to provide interleaved information; and
an aligner coupled to the interleaver to receive the interleaved information.

5. The apparatus according to claim 4, wherein the aligner is coupled to at least one of the first delay and the second delay to provide an adjustment increment thereto for the skew adjustment between the first information on the first data out interface and the second information on the second data out interface.

6. The apparatus according to claim 3, wherein:
the first delay is a fixed delay; and
the second delay is adjustable for the skew adjustment between the first information on the first data out interface and the second information on the second data out interface.

7. The apparatus according to claim 3, wherein the first delay and the second delay are both adjustable for the skew adjustment in only one direction between the first information on the first data out interface and the second information on the second data out interface.

8. The apparatus according to claim 4, wherein some or all of each of the first delay, the second delay, the interleaver, and the aligner are instantiated in programmable resources.

9. The apparatus according to claim 4, wherein the programmable resources are of a Field Programmable Gate Array device.

10. The apparatus according to claim 1, wherein the first data out interface and the second data out interface are for coupling to an array of programmable resources.

11. The apparatus according to claim 10, wherein the array of programmable resources is of a Field Programmable Gate Array device.

12. The apparatus according to claim 1, wherein the data eye path is a non-destructive path with respect to the data path.

13. The apparatus according to claim 1, wherein the data eye path is not coupled to the first data out interface.

14. The apparatus according to claim 1, wherein the data eye path of the first serializer-deserializer is coupled to the second data path of the second serializer-deserializer through a multiplexer of the second serializer-deserializer.

15. The apparatus according to claim 14, wherein the multiplexer is in a hard physical coding sublayer ("PCS") logic block of the second serializer-deserializer.

16. A method, comprising:
receiving first serial information to a first serializer-deserializer at a line rate;
oversampling the first serial information on each of a first data path and a data eye path of the first serializer-deserializer to respectively provide first parallel information and second parallel information;
wherein the first data path is coupled to a first data out interface of the first serializer-deserializer;
outputting the first parallel information via the first data out interface;
providing the second parallel information from the data eye path of the first serializer-deserializer to a second data path of a second serializer-deserializer;
wherein the second data path is coupled to a second data out interface of the second serializer-deserializer; and
outputting the second parallel information via the second data out interface.

17. The method according to claim 16, wherein each of the first parallel information and the second parallel information is oversampled at one-half of an effective oversampling rate.

18. The method according to claim 16, further comprising interleaving the first parallel information with the second parallel information to provide interleaved information.

19. The method according to claim 18, further comprising:
determining an adjustment amount for skew between the first parallel information and the second parallel information in the interleaved information; and
adjusting delay of at least one of the first parallel information and the second parallel information by the adjustment amount to reduce the skew.

20. The method according to claim 18, wherein the first data out interface and the second data out interface are for coupling to an array of programmable resources.

\* \* \* \* \*